United States Patent
Athas

(10) Patent No.: US 6,889,235 B2
(45) Date of Patent: *May 3, 2005

(54) METHOD AND APPARATUS FOR QUANTIFYING THE NUMBER OF IDENTICAL CONSECUTIVE DIGITS WITHIN A STRING

(75) Inventor: William C. Athas, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 607 days.

This patent is subject to a terminal disclaimer.

(21) Appl. No.: 09/991,098
(22) Filed: Nov. 16, 2001

(65) Prior Publication Data

US 2003/0097386 A1 May 22, 2003

(51) Int. Cl.[7] .............................................. G06F 15/00
(52) U.S. Cl. ........................ 708/210; 708/211; 341/160
(58) Field of Search ................................ 708/210, 211; 341/160

(56) References Cited

U.S. PATENT DOCUMENTS

| | | | | |
|---|---|---|---|---|
| 4,954,978 A | * | 9/1990 | Terane et al. ................ | 708/211 |
| 5,187,678 A | * | 2/1993 | Hori ............................. | 708/205 |
| 5,511,222 A | * | 4/1996 | Shiba et al. ................. | 341/160 |
| 6,195,673 B1 | * | 2/2001 | Park ............................. | 708/211 |
| 6,329,838 B1 | * | 12/2001 | Hayakawa .................... | 326/38 |
| 6,560,622 B2 | * | 5/2003 | Katano ........................ | 708/211 |

* cited by examiner

Primary Examiner—Chuong Dinh Ngo
(74) Attorney, Agent, or Firm—Park, Vaughan & Fleming LLP

(57) ABSTRACT

One embodiment of the present invention provides a system for quantifying a number of identical consecutive digits starting from a fixed position within a string of n digits. The system operates by converting the string of n digits into a thermometer code, wherein the thermometer code uses m bits to represent a string of m identical consecutive digits within the string of n digits. Next, the system converts the thermometer code into a one-hot code in which only one bit has a logical one value. Finally, the system converts the one-hot code into a logarithmic code representing the number of identical consecutive digits.

21 Claims, 5 Drawing Sheets

| b0 | b1 | b2 | b3 | x0 | x1 | x2 | x3 | x4 | x5 | x6 | x7 | x8 | x9 | x10 | x11 |
|---|---|---|---|---|---|---|---|---|---|---|---|---|---|---|---|
| 0 | 0 | 0 | 0 |   |   |   |   |   |   |   |   |   |   |   |   |
| 0 | 0 | 0 | 1 | 1 |   |   |   |   |   |   |   |   |   |   |   |
| 0 | 0 | 1 | 0 |   | 1 |   |   |   |   |   |   |   |   |   |   |
| 0 | 0 | 1 | 1 |   |   | 1 |   |   |   |   |   |   |   |   |   |
| 0 | 1 | 0 | 0 |   |   |   | 1 |   |   |   |   |   |   |   |   |
| 0 | 1 | 0 | 1 |   |   |   |   | 1 |   |   |   |   |   |   |   |
| 0 | 1 | 1 | 0 |   |   |   |   |   | 1 |   |   |   |   |   |   |
| 0 | 1 | 1 | 1 |   |   |   |   |   |   | 1 |   |   |   |   |   |
| 1 | 0 | 0 | 0 |   |   |   |   |   |   |   | 1 |   |   |   |   |
| 1 | 0 | 0 | 1 |   |   |   |   |   |   |   |   | 1 |   |   |   |
| 1 | 0 | 1 | 0 |   |   |   |   |   |   |   |   |   | 1 |   |   |
| 1 | 0 | 1 | 1 |   |   |   |   |   |   |   |   |   |   | 1 |   |
| 1 | 1 | 0 | 0 |   |   |   |   |   |   |   |   |   |   |   | 1 |

METHOD AND APPARATUS FOR QUANTIFYING THE NUMBER OF IDENTICAL CONSECUTIVE DIGITS WITHIN A STRING

BACKGROUND

1. Field of the Invention

The present invention relates to the design of digital circuitry for performing arithmetic operations. More specifically, the present invention relates to a method and an apparatus for quantifying a number of identical consecutive digits starting from a fixed position within a string of digits.

2. Related Art

As computer networks grow increasingly more powerful, it is becoming possible to communicate streaming video over a computer network to be displayed on a remote computer system. One of the challenges in doing so is to compress the video data so that it can be transmitted efficiently across the computer network. During this compression process, one commonly performed arithmetic operation is to quantify run-lengths of identical digits in the stream of video data. This allows a compression algorithm to efficiently compress sequences of identical digits. Note that this quantification process must take place rapidly to keep pace with the bandwidth requirements of streaming video. Unfortunately, existing video processing circuitry is typically unable to quantify sequences of consecutive identical digits in an efficient manner.

The run-length quantification operation also occurs in other common computational tasks that are not necessarily related to video compression. For example, during a floating-point arithmetic operation, it is often necessary to normalize the result of the floating-point operation by eliminating leading zeros. In order to do so, the floating-point circuitry must somehow determine the number of leading zeros in the result. Note that this normalization process must take place as rapidly as possible in order to achieve optimal floating-point performance.

Hence, what is needed is a method and an apparatus for quantifying the number of identical consecutive digits within a string of digits in an efficient manner.

SUMMARY

One embodiment of the present invention provides a system for quantifying a number of identical consecutive digits starting from a fixed position within a string of n digits. The system operates by converting the string of n digits into a thermometer code, wherein the thermometer code uses m bits to represent a string of m identical consecutive digits within the string of n digits. Next, the system converts the thermometer code into a one-hot code in which only one bit has a logical one value. Finally, the system converts the one-hot code into a logarithmic code representing the number of identical consecutive digits.

In one embodiment of the present invention, converting the string of digits into the thermometer code involves passing the string of digits through $\lceil \log_2 n \rceil$ layers of AND gates, wherein a first layer of AND gates produces thermometer codes for sub-strings of length two, and wherein each consecutive layer produces thermometer codes for sub-strings of length k+1 to 2k by ANDing together thermometer codes for sub-strings of length 1 to k from preceding layers.

In one embodiment of the present invention, converting the thermometer code into the one-hot code involves passing the thermometer code through a single layer of two-input comparator gates, wherein a given comparator gate produces a logical one value when a first input of the comparator gate receives a logical one value and a second input receives a logical zero value. A single comparator gate is coupled between each consecutive pair of thermometer code bits, so that only one comparator gate, covering the boundary between consecutive logical ones and consecutive logical zeros, produces a logical one value.

In one embodiment of the present invention, converting the one-hot code into the logarithmic code involves passing the one-hot code through $\lceil \log_2 n \rceil - 1$ layers of OR gates, wherein a given bit in the logarithmic code is produced by ORing together bits of the one-hot code that cause the given bit in the logarithmic code to be asserted.

In one embodiment of the present invention, the string of n digits is a string of n binary digits.

In one embodiment of the present invention, the fixed position in the string of n digits is the beginning of the string, so that the number of leading identical consecutive digits is quantified. In a variation on this embodiment, the number of leading zero values is quantified.

In one embodiment of the present invention, the system uses the logarithmic code to normalize a result of a floating-point arithmetic operation.

In one embodiment of the present invention, the system uses the logarithmic code to encode or decode a stream of data, wherein the logarithmic code represents a run-length of identical consecutive digits within the stream of data.

In one embodiment of the present invention, each digit in the string of n digits includes one or more binary digits.

BRIEF DESCRIPTION OF THE FIGURES

FIG. 6 illustrates logic equations for the logarithmic code circuit in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Computer System

Figure 1:
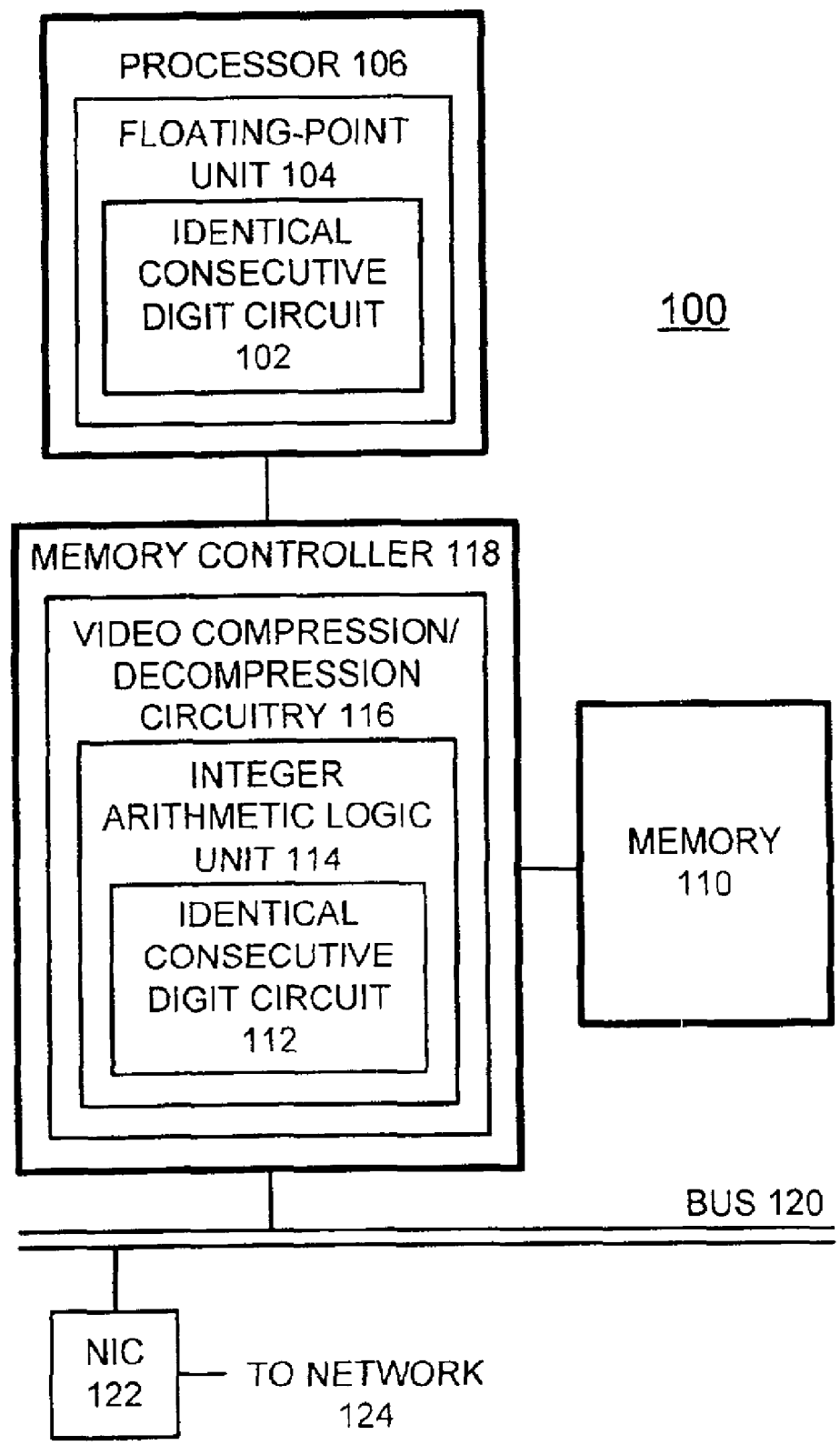
FIG. 1 illustrates a computer system in accordance with an embodiment of the present invention.

FIG. 1 illustrates a computer system 100 in accordance with an embodiment of the present invention. Computer system 100 can generally include any type of computer system, including, but not limited to, a computer system based on a microprocessor, a mainframe computer, a digital signal processor, a portable computing device, a personal organizer, a device controller, and a computational engine within an appliance. Computer system 100 is comprised of a number of components, including processor 106, memory controller 118, memory 110, bus 120 and network interface card (NIC) 122.

In one embodiment of the present invention, processor 106 includes a floating-point unit 104 for performing floating-point operations. Within floating-point unit 104 is a circuit for quantifying identical consecutive digits 102, which is described in more detail below with reference to FIGS. 2–7.

Processor 106 is coupled to memory 110 and bus 120 through memory controller 118. Memory controller 118 can include any type of circuitry that coordinates accesses to memory 110. Memory 110 can include any type of random access memory that stores code and data for use by processor 106. Bus 120 can include any type of communication channel for coupling computer system 100 to peripheral devices, such as NIC 122.

NIC 122 can include any type of interface that can be used to couple computer system 100 with a network 124. Network 124 can generally include any type of wire or wireless communication channel capable of coupling together computing nodes. This includes, but is not limited to, a local area network, a wide area network, or a combination of networks. In one embodiment of the present invention, network 124 includes the Internet.

In one embodiment of the present invention, memory controller 118 includes a video compression/decompression circuitry 116, which can be used to process streaming video received from or sent to other computer systems across network 124. In order to facilitate processing this streaming video, video compression/decompression circuitry 116 includes an integer arithmetic unit 114, which includes a circuit to quantify identical consecutive digits 112 in accordance with an embodiment of the present invention.

Note that when computer system 100 performs floating-point operations, it makes use of identical consecutive digit circuit 102 within floating-point unit 104 to count leading zeros in order to normalize results of floating-point operations.

Similarly, when computer system 100 manipulates streaming video data, it makes use of identical consecutive digit circuit 112 within video compression/decompression circuitry 116 to quantify run lengths of identical digits within a video stream.

The designs of both identical consecutive digit circuit 102 and identical consecutive digit circuit 112 are described in more detail below with reference to FIGS. 2–6.

Note that although the present invention is described in the context of a floating-point unit 104 and video compression/decompression circuitry 116 within a computer system 100, the present invention is not meant to be limited to these implementations. In general, the present invention can be applied in any situation wherein a run length of identical consecutive digits needs to be determined.

Circuit for Counting Identical Consecutive Digits

Figure 2:
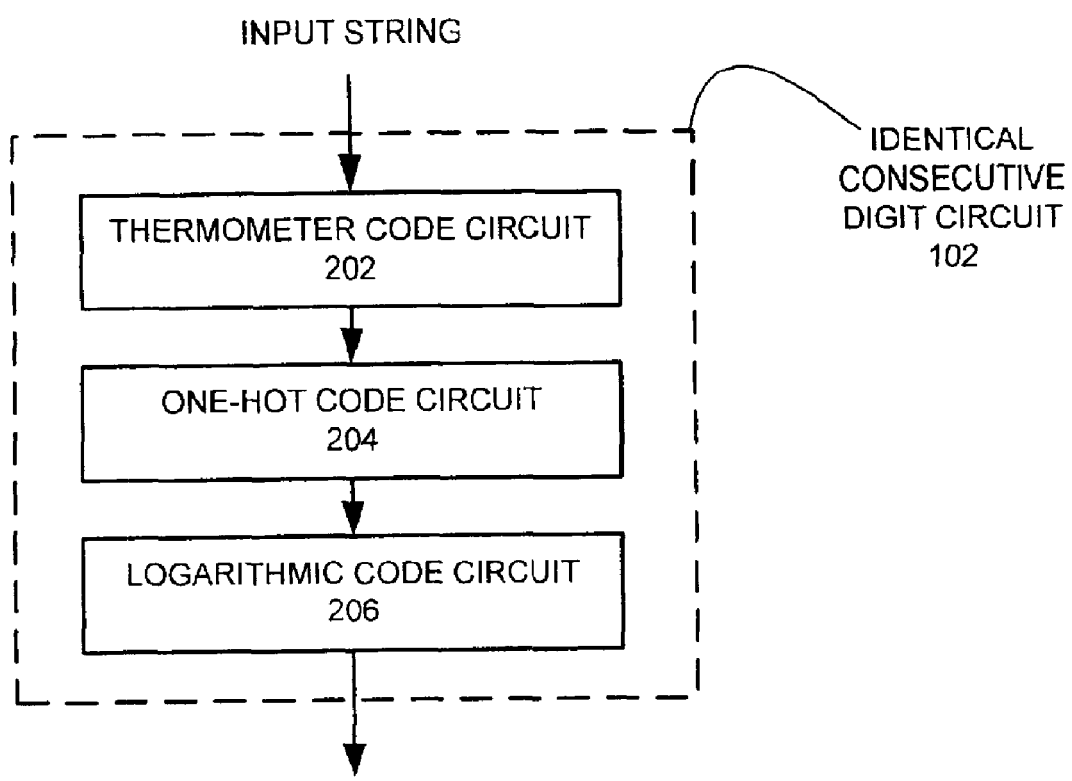
FIG. 2 illustrates a circuit for counting identical consecutive digits in accordance with an embodiment of the present invention.

FIG. 2 illustrates the structure of a circuit for counting identical consecutive digits 102 in accordance with an embodiment of the present invention. Circuit 102 includes a thermometer code circuit 202 that converts a string of n digits into a thermometer code, wherein the thermometer code uses m bits to represent a string of m identical consecutive digits within the string of n digits. For example, assume that the circuit 102 determines the number of leading zeros in the 12-bit string 000001011111. There are five leading zeros in this 12-bit string. Hence, the thermometer code for this string is 111110000000.

The output of thermometer code circuit 102 passes through one-hot code circuit 204 that converts the thermometer code into a one-hot code, wherein only one bit has a logical one value. In the above example, the one-hot code representation for the thermometer code 111110000000 is 000010000000. Note that there is a single one bit in the fifth position of this one-hot code because there are five leading zeros in the original string.

The output of one-hot code circuit 204 passes through logarithmic code circuit 206 that converts the one-hot code into a logarithmic code, such as a binary code or a Gray code, representing the number of identical consecutive digits. In the above example, assume that the logarithmic code is a binary code. In this case, the output of logarithmic code circuit 206 is 0101, which is the binary code for the number five, which represents the five leading zeros in the original string.

Thermometer Code Circuit

Figure 3:
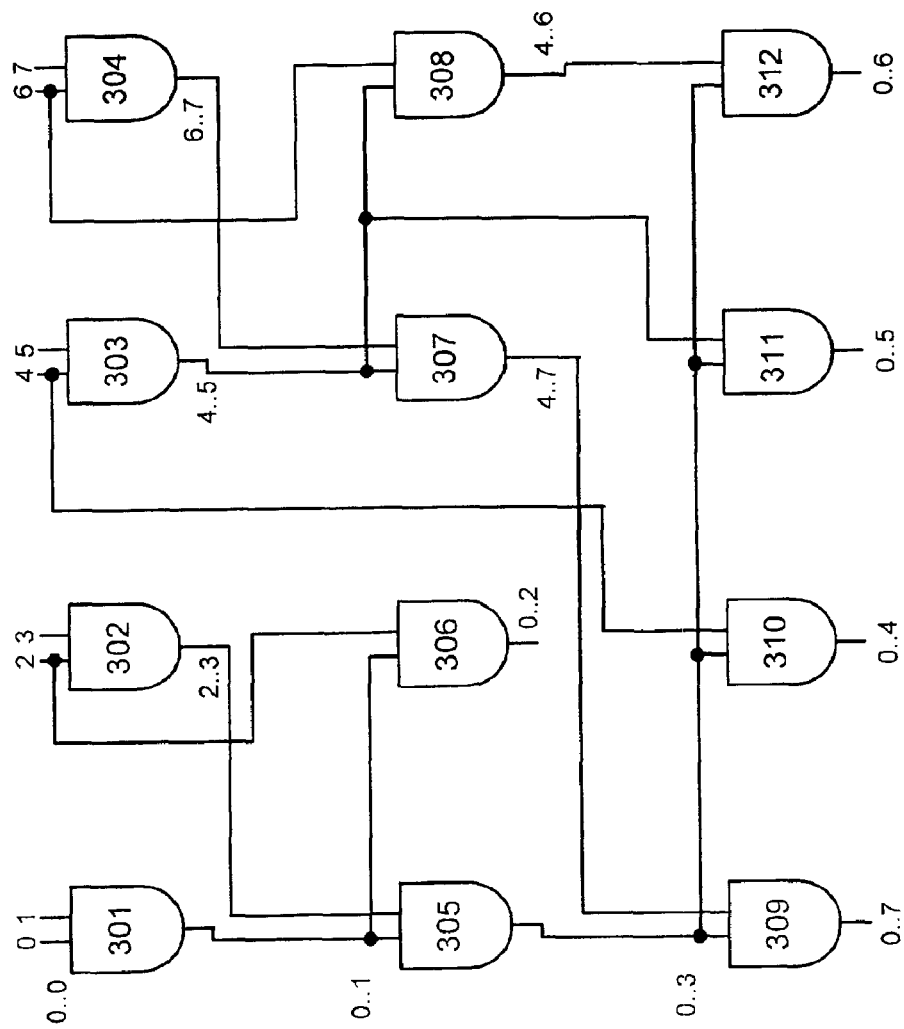
FIG. 3 illustrates a thermometer code circuit in accordance with an embodiment of the present invention.

FIG. 3 illustrates the structure of thermometer code circuit 202 in accordance with an embodiment of the present invention that identifies the number of leading ones in an eight-bit digital string. Note that the number of leading zeros can be identified by inverting the inputs to the circuit illustrated in FIG. 2. This can be accomplished by replacing AND gates 301–304 with NOR gates.

The circuit 202 illustrated in FIG. 3 includes three layers of two-input AND gates that count the number of leading ones in an eight-bit string. This circuit 202 has a recursive structure in which the first level, comprised of AND gates 301–304, detects contiguous digit pairs. More specifically, the 0 input to circuit 202 indicates whether the two-bit string 0 . . . 1 has a single leading one, and the output of AND gate 301 indicates whether the two-bit string 0 . . . 1 has two leading ones. The 2 input to circuit 202 indicates whether the two-bit string 2 . . . 3 has a single leading one, and the output of AND gate 302 indicates whether the two-bit string 2 . . . 3 has two leading ones. The 4 input to circuit 202 indicates whether the two-bit string 4 . . . 5 has a single leading one, and the output of AND gate 303 indicates whether the two-bit string 4 . . . 5 has two leading ones. Finally, the 6 input to circuit 202 indicates whether the two-bit string 6 . . . 7 has a single leading one, and the output of AND gate 304 indicates whether the two-bit string 6 . . . 7 has two leading ones.

The next level of AND gates 305–308 combines with the outputs of the first level to provide a circuit that counts leading ones for the first four inputs 0 . . . 3, as well as a circuit that counts leading ones for the last four inputs 4 . . . 7. More specifically, the 0 input to circuit 202 indicates whether the four-bit string 0 . . . 3 has a single leading one, the output of AND gate 301 indicates whether it has two leading ones, the output of AND gate 306 indicates whether it has three leading ones, and the output of AND gate 305 indicates whether it has four leading ones. Similarly, the 4 input to circuit 202 indicates whether the four-bit string 4 . . . 7 has a single leading one, the output of AND gate 303 indicates whether it has two leading ones, the output of AND gate 308 indicates whether it has three leading ones, and the output of AND gate 307 indicates whether it has four leading ones.

The last level of AND gates 309–312 combines with outputs of preceding levels to count leading zeros for the entire eight-bit string. More specifically, the 0 input to circuit 202 indicates whether the eight-bit string 0 . . . 7 has a single leading one, the output of AND gate 301 indicates whether it has two leading ones, the output of AND gate 306 indicates whether it has three leading ones, the output of AND gate 305 indicates whether it has four leading ones, the output AND gate 310 indicates whether it has five leading ones, the output AND gate 311 indicates whether it has six leading ones, the output AND gate 312 indicates whether it has seven leading ones, and the output AND gate 309 indicates whether it has eight leading ones.

Note this circuit can be generalized to count leading ones for any n-bit string by using $\lceil \log_2 n \rceil$ levels of AND gates. For example, the C-code that appears in Table 1 below generates the AND-gate matrix in FIG. 3.

TABLE 1

```
main( )
{ int i, j, k ;
    for (i=1 ; i<N ; i=2*i)
        { for (j=0 ; j<N ; j=j+2*i)
            for (k=i; k<2*i; k++)
                (void) printf("(%2d, %2d) ", j,j+k);
            (void) printf ("\n");
        }
}
```

This code works for any non-zero value of N that is a power of 2. Note that the inputs to the first layer of AND gates in FIG. 3 should be inverted if we are looking for contiguous strings of zeros. To find the two inputs for a gate in the matrix, the layers above that gate are searched for values that when combined will produce the required output.

One-Hot Code Circuit

Figures 4, 5:
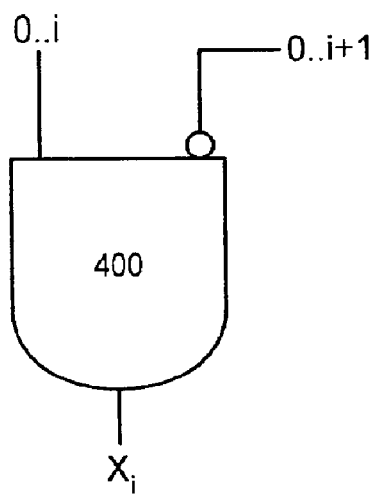
FIG. 4 illustrates a one-hot code circuit in accordance with an embodiment of the present invention.
FIG. 5 illustrates a truth table for a logarithmic code circuit in accordance with an embodiment of the present invention.

FIG. 4 illustrates a one-hot code circuit 204 in accordance with an embodiment of the present invention. This one-hot code circuit 204 is comprised of a single layer of two-input comparator gates, such as AND gate 400. Note that AND gate 400 has one of its inputs complemented, so that AND gate 400 is asserted only if its uncomplemented input receives a one value and its complemented input receives a zero value.

Note that there is a comparator gate coupled between each consecutive pair of thermometer code bits, so that only one comparator gate, covering the boundary between consecutive logical ones and consecutive logical zeros in the thermometer code, produces a logical one value. Hence, only one output of the layer of comparator gates produces a one value.

Logarithmic Code Circuit

FIG. 5 illustrates a truth table for logarithmic code circuit 206 in accordance with an embodiment of the present invention. Logarithmic code circuit 206 receives an n-bit one-hot code from one-hot code circuit 204 and produces a $\lceil \log_2 n \rceil$-bit output containing a logarithmic encoding of the one-hot code. The truth table presented in FIG. 5 illustrates a four-bit binary encoding B0–B3 for a 12-bit one-hot code X0–X11.

Corresponding logic equations for each of the bits, B0–B3, of the binary code appear in FIG. 6. Note that each of these logic equations can be implemented by using one or more OR gates. In the general case of an n-bit one-hot code, each bit of the binary code is associated with n/2 bits of the one-hot code. Hence, n/2 bits of the one-hot code are ORed together to produce each bit in the binary code. This can be accomplished using $\lceil \log_2 n \rceil - 1$ levels of 2-input OR gates.

Propagation Delay and Numbers of Gates

The propagation delay through the thermometer code circuit 202 illustrated in FIG. 3 is $\log_2 n$ gates for an n-bit input string. Furthermore, thermometer code circuit 202 includes approximately $(n/2)\log_2 n$ gates.

Similarly, the propagation delay through one-hot code circuit 204 is one gate, and one-hot code circuit 204 includes approximately n gates.

Finally, the propagation delay through logarithmic code circuit 206 is $\log_2(n/2) = (\log_2 n) - 1$ gates. Furthermore, logarithmic code circuit 206 includes approximately $(n/2)\log_2 n$ gates, because logarithmic code circuit 206 contains a tree of OR gates for each of the $\log_2 n$ bits in the binary code, and each of trees contains approximately $n/2$ gates.

Hence, the total propagation delay through the three stages of the circuit is $\log_2 n + 1 + ((\log_2 n) - 1) = 2\log_2 n$ gates. Furthermore, the circuit contains approximately $(n/2)\log_2 n + n + (n/2)\log_2 n = n\log_2 n + n$ 2-input gates.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for quantifying a number of identical consecutive digits starting from a fixed position within a string of n digits, comprising:

converting the string of n digits into a thermometer code, wherein the thermometer code uses m bits to represent a string of m identical consecutive digits within the string of n digits;

wherein converting the string of digits into the thermometer code involves passing the string of digits through $\lceil \log_m n \rceil$ layers of m-input AND gates, wherein for the case where m=2 a first layer of AND gates produces thermometer codes for sub-strings of length two, and wherein each consecutive layer produces thermometer codes for sub-strings of length k+1 to 2k by ANDing together thermometer codes for sub-strings of length 1 to k from preceding layers;

converting the thermometer code into a one-hot code in which only one bit has a logical one value; and converting the one-hot code into a logarithmic code representing the number of identical consecutive digits.

2. The method of claim 1, wherein converting the thermometer code into the one-hot code involves passing the thermometer code through a single layer of two-input comparator gates;

wherein a given comparator gate produces a logical one value when a first input of the comparator gate receives a logical one value and a second input receives a logical zero value; and wherein a comparator gate is coupled between each consecutive pair of thermometer code bits, so that only one comparator gate, covering a boundary between consecutive logical ones and consecutive logical zeros, produces a logical one value.

3. The method of claim 1, wherein converting the one-hot code into the logarithmic code involves passing the one-hot code through $\lceil \log_2 n \rceil - 1$ layers of OR gates, wherein a given bit in the logarithmic code is produced by ORing together bits of the one-hot code that cause the given bit in the logarithmic code to be asserted.

4. The method of claim 1, wherein the string of n digits is a string of n binary digits.

5. The method of claim 1, wherein the fixed position in the string of n digits is the beginning of the string, so that the number of leading identical consecutive digits is quantified.

6. The method of claim 5, wherein the number of leading zero values is quantified.

7. The method of claim 6, further comprising using the logarithmic code to normalize a result of a floating-point arithmetic operation.

8. The method of claim 1, further comprising using the logarithmic code to encode or decode a stream of data, wherein the logarithmic code represents a run-length of identical consecutive digits within the stream of data.

9. The method of claim 1, wherein each digit in the string of n digits includes one or more binary digits.

10. An apparatus that quantifies a number of identical consecutive digits starting from a fixed position within a string of n digits, comprising:
    a thermometer code circuit that converts the string of n digits into a thermometer code, wherein the thermometer code uses m bits to represent a string of m identical consecutive digits within the string of n digits;
    wherein the thermometer code circuit includes $\lceil \log_m n \rceil$ layers of m-input AND gates, wherein for the case where m=2•a first layer of AND gates produces thermometer codes for sub-strings of length two, and wherein each consecutive layer produces thermometer codes for sub-strings of length k+1 to 2k by ANDing together thermometer codes for sub-strings of length 1 to k from preceding layers;
    a one-hot code circuit that converts the thermometer code into a one-hot code in which only one bit has a logical one value; and
    a logarithmic code circuit that converts the one-hot code into a logarithmic code representing the number of identical consecutive digits.

11. The apparatus of claim 10,
    wherein the one-hot-code circuit includes a single layer of two-input comparator gates;
    wherein a given comparator gate produces a logical one value when a first input of the comparator gate receives a logical one value and a second input receives a logical zero value; and
    wherein a comparator gate is coupled between each consecutive pair of thermometer code bits, so that only one comparator gate, covering a boundary between consecutive logical ones and consecutive logical zeros, produces a logical one value.

12. The apparatus of claim 10, wherein the logarithmic code circuit includes $\lceil \log_2 n \rceil - 1$ layers of OR gates, wherein a given bit in the logarithmic code is produced by ORing together bits of the one-hot code that cause the given bit in the logarithmic code to be asserted.

13. The apparatus of claim 10, wherein the string of n digits is a string of n binary digits.

14. The apparatus of claim 10, wherein the fixed position in the string of n digits is the beginning of the string, so that the number of leading identical consecutive digits is quantified.

15. The apparatus of claim 14, wherein the apparatus quantifies the number of leading zero values.

16. The apparatus of claim 15, further comprising a floating-point arithmetic unit that is configured to use the logarithmic code to normalize a result of a floating-point arithmetic operation.

17. The apparatus of claim 10, farther comprising an encoder that is configured to use the logarithmic code to encode or decode a stream of data, wherein the logarithmic code represents a run-length of identical consecutive digits within the stream of data.

18. The apparatus of claim 10, wherein each digit in the string of n digits includes one or more binary digits.

19. A computer system including a circuit that quantifies a number of identical consecutive digits, comprising:
    a processor;
    a memory;
    a quantifying circuit that quantifies the number of identical consecutive digits starting from a fixed position within a string of n digits, wherein the quantifying circuit includes;
        a thermometer code circuit that converts the string of n digits into a thermometer code, wherein the thermometer code uses m bits to represent a string of m identical consecutive digits within the string of n digits,
        wherein the thermometer code circuit includes $\lceil \log_m n \rceil$ layers of m-input AND gates, wherein for the case when m=2, a first layer of AND gates produces thermometer codes for sub-strings of length two, and wherein each consecutive layer produces thermometer codes for sub-strings of length k+1 to 2k by ANDing together thermometer codes for sub-strings of length 1 to k from preceding layers,
    a one-hot code circuit that converts the thermometer code into a one-hot code in which only one bit has a logical one value; and
    a logarithmic code circuit that converts the one-hot code into a logarithmic code representing the number of identical consecutive digits.

20. The computer system of claim 19, further comprising:
    a floating-point arithmetic unit of within the processor;
    wherein the quantifying circuit is located within the floating-point arithmetic unit and is configured to normalize results of floating-point operations.

21. The computer system of claim 19,
    wherein the computer system includes an encoding circuit for encoding or decoding streams of data; and
    wherein the quantifying circuit is located within the encoding circuit and is configured to quantify run-lengths of identical consecutive digits for the encoding circuit.

* * * * *

UNITED STATES PATENT AND TRADEMARK OFFICE
CERTIFICATE OF CORRECTION

PATENT NO. : 6,889,235 B2
DATED : May 3, 2005
INVENTOR(S) : William C. Athas

It is certified that error appears in the above-identified patent and that said Letters Patent is hereby corrected as shown below:

Column 7,
Line 35, please delete the symbol "m=2•a" and replace with -- m=2, a --.

Signed and Sealed this

Fifth Day of July, 2005

JON W. DUDAS
*Director of the United States Patent and Trademark Office*